United States Patent [19]
Okamura

[11] Patent Number: 5,771,190
[45] Date of Patent: Jun. 23, 1998

[54] SEMICONDUCTOR STATIC RANDOM ACCESS MEMORY DEVICE HAVING MEMORY CELLS COUPLED TO DISCHARGING LINE DIFFERENT IN POTENTIAL LEVEL TO DISCHARGING LINE FOR WRITE-IN CIRCUIT

[75] Inventor: Hitoshi Okamura, Tokyo, Japan

[73] Assignee: NEC Corporation, Tokyo, Japan

[21] Appl. No.: 740,483

[22] Filed: Oct. 30, 1996

[30] Foreign Application Priority Data

Feb. 23, 1996 [JP] Japan .................................. 8-036887

[51] Int. Cl.⁶ .................................................. G11C 11/00
[52] U.S. Cl. ................ 365/154; 365/189.11; 365/230.06
[58] Field of Search ....................... 365/154, 156, 365/177, 203, 230.06, 190, 189.11

[56] References Cited

U.S. PATENT DOCUMENTS

| 5,303,190 | 4/1994 | Pelley, III ........................... 365/189.11 |
| 5,418,749 | 5/1995 | Suda et al. ............................. 365/203 |
| 5,453,949 | 9/1995 | Wiedmann et al. ...................... 365/156 |
| 5,574,687 | 11/1996 | Nakase .............................. 365/189.06 |

FOREIGN PATENT DOCUMENTS

| 2-21654 | 1/1990 | Japan . |
| 4-168694 | 6/1992 | Japan . |
| 7-57476 | 3/1995 | Japan . |

OTHER PUBLICATIONS

H. Okamura et al., "A 1 ns, 1 W, 2.5 V, 32 kb NTL–CMOS SRAM Macro Using a Memory Cell with PMOS Access Transistors", IEEE Journal of Solid–State Circuits, vol. 30, No. 11, Nov. 1995 pp. 1196–1202.

*Primary Examiner*—David C. Nelms
*Assistant Examiner*—Son Mai
*Attorney, Agent, or Firm*—Foley & Lardner

[57] ABSTRACT

A static type random access memory cell stores a data bit supplied from a bit line pair through two p-channel enhancement type access transistors gated by a word line in a two-stable latch circuit powered with a positive high power voltage and a positive low power voltage, and the positive low power voltage is higher than an active level on the word line so that the two-stable latch circuit certainly changes the state depending upon the logic level of a write-in data bit.

13 Claims, 9 Drawing Sheets

SEMICONDUCTOR STATIC RANDOM ACCESS MEMORY DEVICE HAVING MEMORY CELLS COUPLED TO DISCHARGING LINE DIFFERENT IN POTENTIAL LEVEL TO DISCHARGING LINE FOR WRITE-IN CIRCUIT

FIELD OF THE INVENTION

This invention relates to a semiconductor static random access memory device and, more particularly, to a semiconductor static random access memory device having memory cells coupled to a discharging line higher in potential level than a discharging line for a write-in circuit.

DESCRIPTION OF THE RELATED ART

A typical example of the static random access memory cell is implemented by a flip-flop type latch circuit accompanied with two n-channel enhancement type access transistors. An n-channel enhancement type field effect transistor is connected in series to a load element, and a pair of series circuits is coupled between power supply lines. The gate electrode of the n-channel enhancement type field effect transistor of one of the series circuits is connected to the drain node of the n-channel enhancement type field effect transistor of the other of the series circuits, and these two n-channel enhancement type field effect transistors complementarily turn on and off depending upon a potential difference between the drain nodes. The n-channel enhancement type access transistors are coupled between bit lines of an associated pair and the drain nodes, and are concurrently gated by a word line.

When the word line is driven to an active level, the n-channel enhancement type access transistors concurrently turn on, and the bit lines are electrically connected to the drain nodes, respectively. The bit lines have already been equalized, and the n-channel enhancement type field effect transistors selectively connect the bit lines to the power supply lines so as to produce the potential difference between the bit lines.

However, the n-channel enhancement type access transistors decrease the current flowing from the flip-flop type latch circuit to the bit lines due to the threshold, and, accordingly, prolong the development of the potential difference between the bit lines. The n-channel enhancement type access transistors also restrict the current flowing vice versa, and cause a write-in circuit connected to the bit lines to wait until the flip-flop type latch circuit becomes stable.

Thus, the n-channel enhancement type access transistors are less preferable for a high-speed static type random access memory cell, and p-channel enhancement type access transistors have been proposed by the present inventors in Japanese Patent Application No. 5-200847. The same approach is also disclosed in Japanese Patent Publication of Unexamined Application No. 4-168694.

FIG. 1 illustrates the prior art static random access memory cell 1 associated with a precharging circuit 2 and a write-in circuit 3. A flip-flop type latch circuit 1a and a pair of p-channel enhancement type access transistors Qp1/Qp form in combination the prior art static random access memory cell 1. Two series combinations of load element R1/R2 and n-channel enhancement type switching transistors Qn1/Qn2 are connected in parallel between a positive power voltage line Vdd and a ground line GND, and the drain nodes DN1/DN2 of the n-channel enhancement type switching transistors Qn1/Qn2 are connected to the gate electrodes of the n-channel enhancement type switching transistors Qn2/Qn1. The p-channel enhancement type access transistors Qp1/Qp2 are connected between bit lines BLa/BLb and the drain nodes DN1/DN2, and are gated by a word line WL.

The n-channel enhancement type switching transistors Qn1/Qn2 and the p-channel enhancement type access transistors Qp1/Qp2 have respective channels in the semiconductor substrate, and are a bulk transistor. The bulk transistor provides a small channel resistance, and the on-resistance of the p-channel enhancement type access transistor Qp1/Qp2 is of the order of tens kilo-ohms. On the other hand, the load elements R1 and R2 are implemented by polysilicon strips or thin film transistors, and the polysilicon strip or the thin film transistor provides resistance of the order of 1 tera-ohms. Thus, the load element R1/R2 is much larger in resistance than the p-channel enhancement type access transistor Qp1/Qp2.

Row addresses are respectively assigned to the word line WL and other word lines, and a word line driver 4 is responsive to a row address signal ADD representative of one of the row addresses for driving the word line to an active low level. When the word line WL is changed to the active low level, the p-channel enhancement type access transistors Qp1/Qp2 concurrently turn on so as to electrically connect the bit lines BLa/BLb to the drain nodes DN1/DN2.

The word line driver 4 is implemented by a CMOS inverter, and the CMOS inverter changes the word line WL between the active low level and the inactive high level. A bi-CMOS circuit or a bipolar circuit is available for the word line driver 4. Two circuit configurations of the biCMOS/bipolar circuits are illustrated in FIGS. 2A and 2B.

The word line driver 4 shown in FIG. 2A includes a complementary inverter 4a, i.e., a series combination of a p-channel enhancement type switching transistor and an n-channel enhancement type switching transistor and an output driver 4b implemented by a bi-NMOS push-pull driver logic circuit. The complementary inverter 4a generates a complementary address decoded signal CADD from the address decoded signal ADD, and the address decoded signal ADD and the complementary address decoded signal CADD complementarily change the n-p-n type bipolar transistor and the n-channel enhancement type switching transistor of the output driver 4b between on-state and off-state for driving the word line WL. The word line driver 4 may have a circuit configuration shown in FIG. 2B, and an input inverter 4a ' and an output driver 4b ' are fabricated from n-p-n type bipolar transistors and resistors.

Turning back to FIG. 1, the precharging circuit 2 charges and equalizes the bit lines BLa and BLb, and is connected between the positive power voltage line Vdd and the bit lines BLa/BLb. P-channel enhancement type switching transistors Qp3/Qp4, an inverter INV1 and an n-channel enhancement type switching transistor Qn3 form in combination the precharging circuit 2. The p-channel enhancement type switching transistors Qp3/Qp4 are coupled between the positive power voltage line Vdd and the bit lines BLa/BLb, and the n-channel enhancement type switching transistor Qn3 is connected between the bit lines BLa and BLb.

A precharge control signal PC is supplied to the gate electrodes of the p-channel enhancement type switching transistors Qp3/Qp4 and the input node of the inverter INV1, and the inverter INV1 supplies a complementary precharge control signal CPC to the gate electrode of the n-channel enhancement type switching transistor Qn3. While the precharge control signal PC is in the inactive high level, all the switching transistors Qp3, Qp4 and Qn3 are turned off. However, when the precharge control signal PC is changed to the active low level, the precharge control signal PC and the complementary precharge control signal CPC cause the p-channel enhancement type switching transistors Qp3/Qp4 and the n-channel enhancement type switching transistor Qn3 to concurrently turn on, and the bit lines BLa and BLb are equalized to the positive power voltage level Vdd.

The write-in circuit 3 is connected between the bit lines BLa/BLb and the ground line GND, and n-channel enhancement type switching transistors Qn4/Qn5 constitute the write-in circuit 3. The n-channel enhancement type switching transistors Qn4/Qn5 are connected between the bit lines BLa/BLb and the ground line GND, and are responsive to write-in data signals DWa/DWb complementary to each other for selectively discharging the bit lines BLa/BLb.

The prior art static type random access memory device shown in FIG. 1 behaves in a data read-out from the memory cell 1 as follows. The memory cell 1 is assumed to store a data bit represented by the ground level at the drain node DN1 and the positive power voltage level Vdd at the drain node DN2.

First, the precharge control signal PC is changed to the active low level, and the precharge circuit 2 charges the bit lines BLa and BLb to the positive power voltage level Vdd. Subsequently, the word line driver 4 changes the word line WL from the inactive high level to the active low level as low as the ground level, and causes the p-channel enhancement type access transistors Qp1/Qp2 to turn on. Then, the drain nodes DN1/DN2 are respectively connected to the bit lines BLa/BLb.

The data bit stored in the memory cell 1 has already caused the n-channel enhancement type switching transistors Qn1 and Qn2 to be turned on and off, respectively. For this reason, the bit line BLa is electrically connected through the p-channel enhancement type access transistor Qp1 and the n-channel enhancement type switching transistor Qn1 to the ground level, and the other bit line BLb is electrically connected through the p-channel enhancement type access transistor Qp2 and the load element R2 to the positive power voltage line Vdd. Current flows from the p-channel enhancement type switching transistor Qp3 through the bit line BLa to the ground line GND, and the potential level on the bit line BLa is decreased to a potential level given by a proportional distribution of the positive power voltage level Vdd in the ratio between the resistance of the p-channel enhancement type switching transistor Qp3 and the total resistance of the p-channel enhancement type access transistor Qp1 and the n-channel enhancement type switching transistor Qn1. The current flowing through the memory cell 1 is hereinbelow referred to as "cell current". On the other hand, no cell current flows through the bit line BLb, because the n-channel enhancement type switching transistor Qn2 is turned off, and the bit line BLb maintains the positive power voltage Vdd.

The potential difference between the bit lines BLa and BLb is propagated to a sense amplifier (not shown) so as to accelerate the potential development, and, thereafter, the read-out data bit represented by the potential difference is supplied to the outside of the prior art static type random access memory device.

Thus, the cell current develops the potential difference on the bit line pair BLa/BLb, and the p-channel enhancement type access transistors Qp1/Qp2 allows a large amount of cell current to flow therethrough. In fact, the present inventor measured the cell current passing through the p-channel enhancement type access transistor and cell current passing through an n-channel enhancement type access transistor corresponding to the p-channel enhancement type access transistor, and the amount of cell current passing through the p-channel enhancement type access transistor and the amount of cell current passing through the n-channel enhancement type access transistor were plotted in FIG. 3. Plots PL1 represent the cell current passing through the p-channel enhancement type access transistor, and plots PL2 stand for the cell current passing through the n-channel enhancement type access transistor. Hence, the word drivers shown in FIGS. 2A and 2B are assumed to drive the word line. Comparing plots PL1 with plots PL2, it is understood that the p-channel enhancement type access transistor is superior to the n-channel enhancement type access transistor. The p-channel enhancement type access transistor has a large current driving capability, and achieves a high-speed data access even if the power voltage level Vdd is lowered.

The prior art static type random access memory device behaves in a data write-in as follows. The memory cell 1 has stored a data bit represented by the low potential level at the drain node DN1 and the high potential level at the other drain node DN1, and the write-in data bit is opposite in logic level to the data bit already stored in the memory cell 1. The precharge circuit 2 electrically connects the bit lines BLa and BLb to the positive power voltage line Vdd, and the bit lines BLa/BLb are charged to the positive power voltage level Vdd. The word line driver 4 changes the word line WL to the ground level, and the p-channel enhancement type access transistors Qp1/Qp2 turn on so as to electrically connect the bit lines BLa/BLb to the drain nodes DN1/DN2, respectively.

The write-in data signals DWa/DWb representative of the write-in data bit cause the n-channel enhancement type switching transistors Qn4 and Qn5 to turn on and off, respectively, and only the bit line BLb is discharged through the n-channel enhancement type switching transistor Qn5. The positive power voltage line Vdd supplies current through the precharge circuit 2, the bit line BLa and the p-channel enhancement type access transistor Qp1 to the drain node DN1, and the current pulls up the potential level at the drain node DN1.

If the p-channel enhancement type access transistors Qp1/Qp2 are replaced with n-channel enhancement type access transistors, the n-channel enhancement type access transistor turns off when the bit line BLa reaches the potential level equal to (Vdd - threshold), and the drain node DN1 is charged through the highly-resistive load element R1 of the order of 1 tera-ohms. Only a small amount of current flows through the highly-resistive load element R1, and slowly raises the potential level at the drain node DN1. On the other hand, the p-channel enhancement type access transistor Qp1 is free from the deceleration in current charge due to the threshold thereof, and rapidly charges the drain node DN1. As a result, the flip-flop type latch 1a is changed to the opposite status, and the write-in data bit is stored in the memory cell 1.

Another static random access memory cell is disclosed in Japanese Patent Publication of Unexamined Application No. 2-21654. The prior art static random access memory cell disclosed therein has the load elements and the access transistors implemented by thin film transistors. The thin film transistors make the fabrication process simple; however, the thin film transistors are large in resistance, and the data write-in is not faster than the data write-in through the p-channel bulk access transistors.

As described hereinbefore, the p-channel enhancement type access transistors Qp1/Qp2 improve the data access speed and the data write-in speed in so far as they are formed on the semiconductor substrate.

However, the prior art static type random access memory device encounters a problem in that the flip-flop type latch circuit 1a does not respond to a write-in data bit opposite in logic level to the data bits already stored therein.

A data write-in is carried out by the write-in circuit 3, and the write-in circuit 3 selectively connects the bit lines BLa/BLb to the ground line GND. Assuming now that the memory cell 1 stores a data bit represented by the positive power voltage level Vdd at the drain node DN1 and the ground level at the other drain node DN2, the write-in circuit 3 connects the bit line BLa to the ground line GND for the write-in data bit opposite in logic level to the stored data bit. The potential level on the bit line BLa is decayed toward the ground level, and, accordingly, the drain node DN1 decreases the potential level. However, when the potential level on the bit line BLa reaches a certain potential level higher than the ground level by the threshold of the p-channel enhancement type access transistor Qp1, the p-channel enhancement type access transistor Qp1 turns off, and the drain node maintains the certain positive potential level. If the certain positive potential level is higher than the inversive threshold of the flip-flop type latch circuit 1a or the threshold of the n-channel enhancement type switching transistor Qn2, the write-in data bit does not invert the logic state of the flip-flop type latch circuit 1a, and the flip-flop type latch circuit 1a is recovered to the initial state when the word line driver 4 changes the word line to the inactive high level. When the load elements R1/R2 are implemented by the highly-resistive polysilicon strips or the thin-film transistors, the inversive threshold is of the order of 0.1 volt. On the other hand, standard p-channel enhancement type access transistors Qp1/Qp2 have the threshold of the order of 0.6 volt. Thus, the p-channel enhancement type access transistors are not feasible in so far as the series combinations of the load-elements R1/R2 and the n-channel enhancement type switching transistors Qn1/Qn2 form the flip-flop type latch circuit 1a. If the flip-flop type latch circuit 1a is implemented by two complementary inverters, i.e., two series combination of p-channel enhancement type switching transistors and n-channel enhancement type switching transistors, the p-channel enhancement type access transistors Qp1/Qp2 are available without the first problem; however, the complementary inverters decrease the noise margin in a data write-in.

The second problem encountered in the prior art static type random access memory device is misjudging the logic level of a read-out data bit. The second problem is derived from the relation between the word line driver 4 and the p-channel enhancement type access transistors Qp1/Qp2.

As described hereinbefore, the word line driver 4 drives the word line WL through the emitter-follower type output driver 4b/4b'. The n-p-n type bipolar transistor of the output driver 4b/4b' is assumed to have the emitter-base forward bias Vbe, and the emitter-follower type output driver 4b/4b' changes the word line WL between a high potential level (Vdd-Vbe) and a low potential level as low as the ground level. If the emitter-base forward bias Vbe is nearly equal to the threshold of the p-channel enhancement type access transistors Qp1/Qp2, leakage current flows through the p-channel enhancement type access transistors Qp1/Qp2. If the static random access memory cells coupled to the bit lines BLa/BLb are increased, the leakage current is not negligible and decays the potential level on the bit line connected through the memory cell 1 to the positive power supply line Vdd. This results in that the potential levels on the bit lines BLa/BLb become close to each other, and the sense amplifier tends to misjudge the logic level of the read-out data bit. In order to prevent the sense amplifier misjudgment, it is necessary to decrease the number of static random access memory cells coupled to each pair of bit lines Bla/BLb or to increase the threshold of the p-channel enhancement type access transistors Qp1/Qp2.

The reduction of the memory cells is never employable, because users strongly request the semiconductor device manufacturer to increase the memory capacity of the static type random access memory device.

On the other hand, if the thresholds of the p-channel enhancement type access transistors Qp1/Qp2 are increased, the first problem becomes serious. Thus, there is a tradeoff between the first problem and the second problem.

SUMMARY OF THE INVENTION

It is therefore an important object of the present invention to provide a static type random access memory device which exactly writes a data bit in a memory cell at high speed.

It is also an important object of the present invention to provide a static random access memory device which exactly judges a read-out data bit at high speed.

To accomplish the first object, the present invention proposes to make a low power voltage line for a memory cell higher than a discharging line of a write-in circuit.

In accordance with one aspect of the present invention, there is provided a semiconductor static type random access memory device comprising: a plurality of addressable memory cells each including a bi-stable latch circuit connected between a high power voltage line and a low power voltage line and first and second p-channel type access transistors having conductive channels connected to first and second memory nodes of the bi-stable latch circuit for storing a data bit in the form of potential difference between the first and second memory nodes; a plurality of bit line pairs selectively connected to the conductive channels of the first and second p-channel type access transistors of the plurality of addressable memory cells for propagating data bits thereto and therefrom; a means for supplying a low power voltage to the low power voltage line; a plurality of word lines selectively connected to gate electrodes of the first and second p-channel type access transistors of the plurality of addressable memory cells, and selectively driven to an active low level lower than the low power voltage for selectively connecting the first and second memory nodes of the plurality of addressable memory cells to the plurality of bit line pairs; and a write-in circuit connectable through one of the plurality of bit line pairs to each of the plurality of addressable memory cells, and responsive to a write-in data bit for selectively connecting bit lines of the aforesaid one of the plurality of bit line pairs to a discharging line, a potential level on the discharging line being lower than the low power voltage.

To accomplish the second object, the present invention proposes to lower a precharge level on bit line pairs.

In accordance with another aspect of the present invention, there is provided a semiconductor static type random access memory device comprising: a plurality of addressable memory cells each including a bi-stable latch circuit connected between a high power voltage line and a low power voltage line and first and second p-channel type access transistors having conductive channels connected to first and second memory nodes of the bi-stable latch circuit for storing a data bit in the form of potential difference between the first and second memory nodes; a plurality of bit line pairs selectively connected to the conductive channels of the first and second p-channel type access transistors of the plurality of addressable memory cells for propagating data bits thereto and therefrom; a plurality of word lines selectively connected to gate electrodes of the first and second p-channel type access transistors of the plurality of addressable memory cells, and selectively driven from an inactive high level lower than a high power voltage level on the high power voltage line to an active low level for selectively connecting the first and second memory nodes of the plurality of addressable memory cells to the plurality of bit line pairs; a precharging circuit connected between a precharging line and the plurality of bit line pairs for charging the plurality of bit line pairs at a precharge level lower than the high power voltage level before a data read-out from memory cells selected from the plurality of memory cells to the plurality of bit line pairs; and a means for generating the precharge level on the precharging line.

BRIEF DESCRIPTION OF THE DRAWINGS

The features and advantages of the semiconductor memory device according to the present invention will be more clearly understood from the following description taken in conjunction with the accompanying drawings in which.

DESCRIPTION OF THE PREFERRED EMBODIMENTS

First Embodiment

Figure 4:
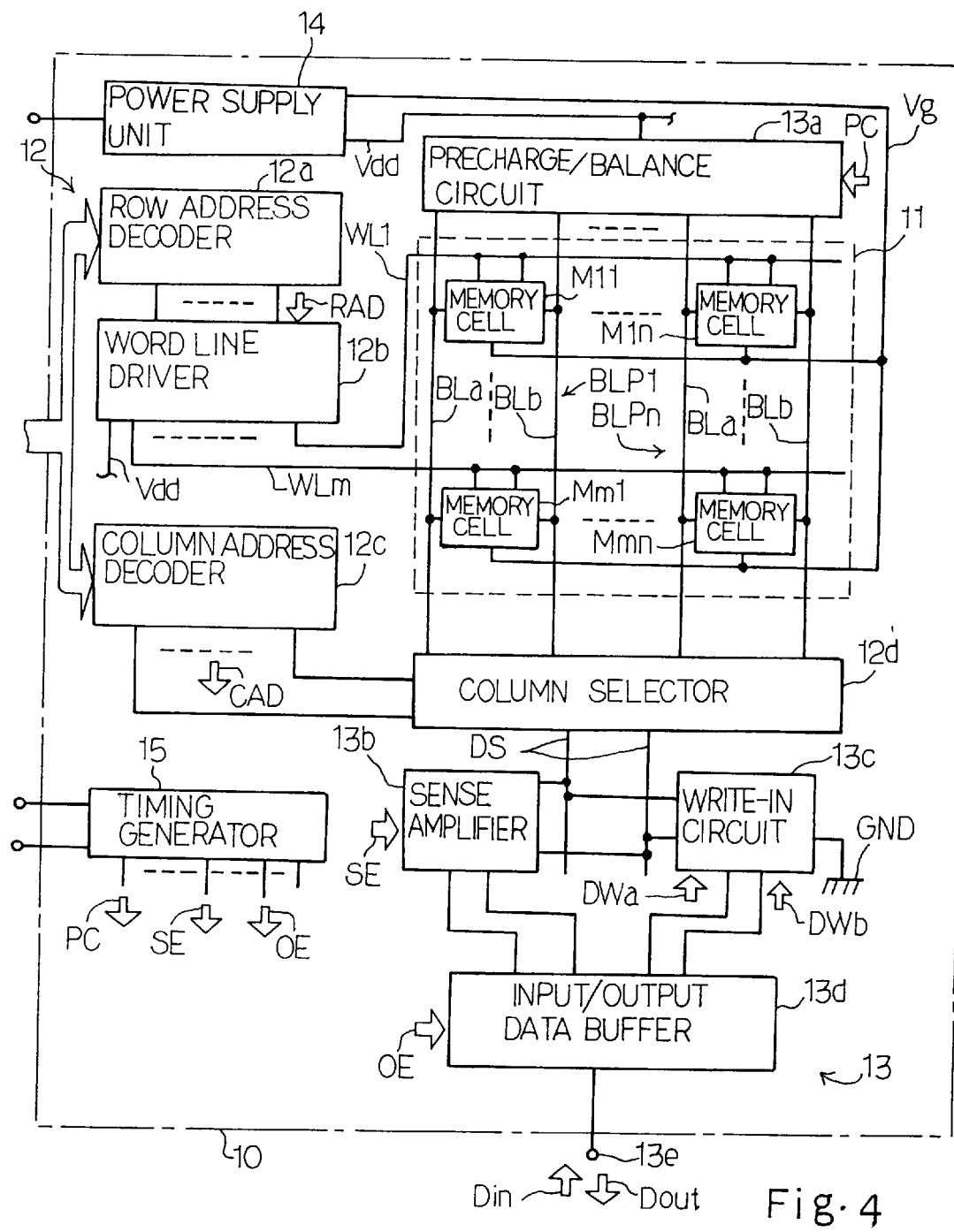
FIG. 4 is a block diagram showing the circuit arrangement of a semiconductor static random access memory device according to the present invention.

Referring first to FIG. 4 of the drawings, a static type random access memory device embodying the present invention is fabricated on a semiconductor substrate 10, and largely comprises a memory cell array 11, an addressing system 12, a read-write system 13, a power supply unit 14 and a timing generator 15.

Figure 5:
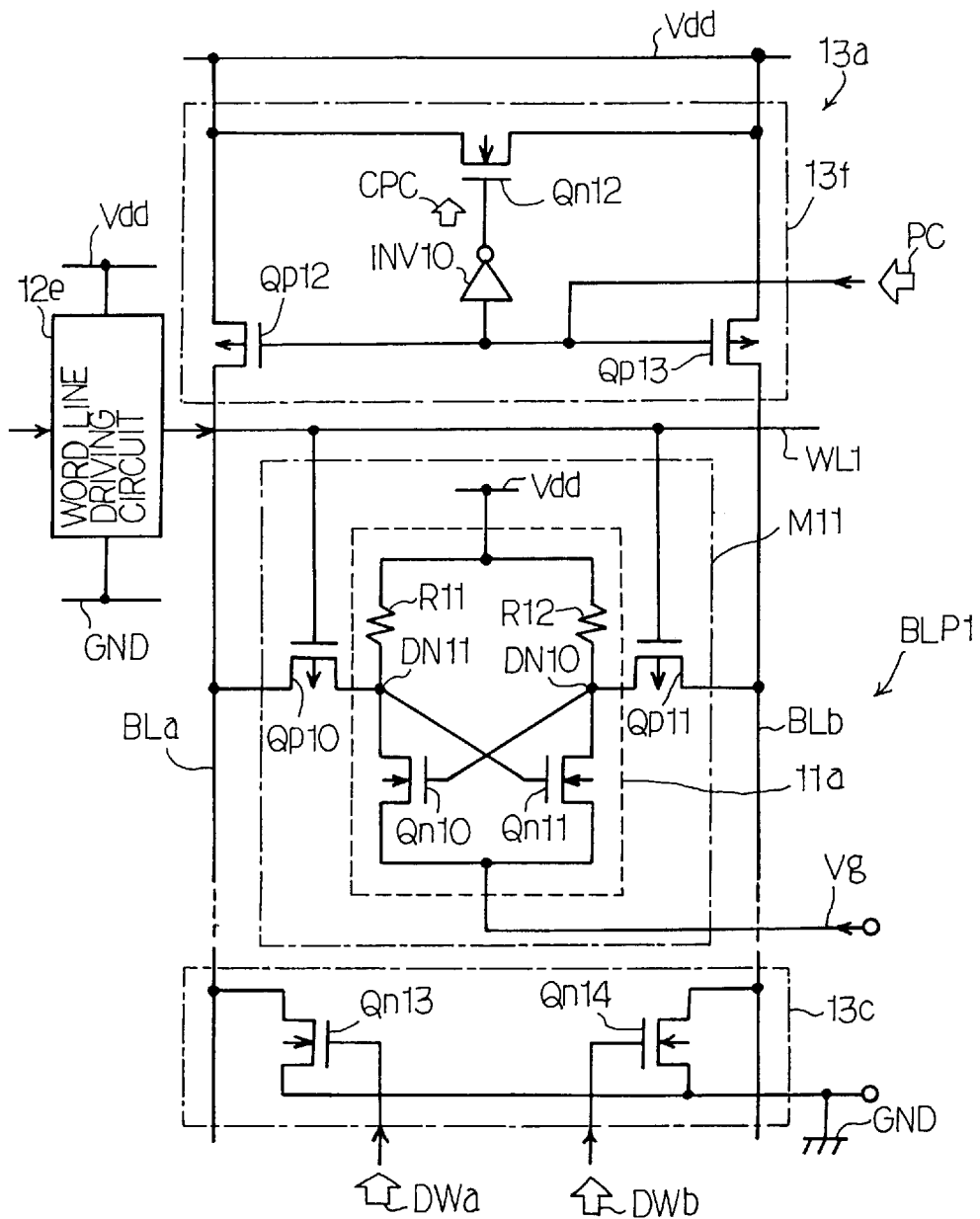
FIG. 5 is a circuit diagram showing a memory cell, a precharge/balance circuit and a write-in circuit incorporated in the static type random access memory device.

A plurality of memory cells M11, . . . , Mn1, . . . , Mm1, . . . and Mmn are arranged in rows and columns, and form in combination the memory cell array 11. A plurality of word lines WL1 to WLm are respectively associated with the rows of memory cells M11-M1n to Mm1-Mmn, and a plurality of bit line pairs BLP1 to BLPn are coupled to the columns of memory cells M11-Mm1 to M1n-Mmn. The bit lines of each bit line pair are labeled with BLa and BLb, respectively. The memory cells M11 to Mmn are identical in circuit configuration with one another, and one of the memory cells such as that labeled with M11 is illustrated in detail in FIG. 5.

The memory cell M11 includes a flip-flop type latch circuit 11a connected between a positive high power voltage line Vdd and a positive low power voltage line Vg and p-channel enhancement type access transistors QP10/Qp11 connected between the flip-flop type latch circuit 11a and the bit lines BLa/BLb of the associated pair BLP1, and the flip-flop type latch circuit 11a is implemented by two series combination of load elements R11/R12 and n-channel enhancement type switching transistors Qn10/Qn11. In this instance, the drain nodes DN11/DN10 of the n-channel enhancement type switching transistors Qn10/Qn11 serve as first and second memory nodes.

The positive low power voltage line Vg pushes up the gate voltage of the n-channel enhancement type switching transistor Qn10/Qn11 at an inversion of the latch circuit 11a, and, accordingly, is expected to cancel the potential level at the drain node DN10/DN11 due to the threshold of the p-channel enhancement type access transistor QP10/Qp11.

In order to invert the logic level of the stored data bit, the potential drop at the drain node DN1O/DN11 is expected to cause the n-channel enhancement type switching transistor Qn10/Qn11 to turn off. Even through the p-channel enhancement type access transistor Qp11/QP10 turns off at the potential level higher than the ground level by the threshold thereof, the n-channel enhancement type switching transistor Qn10/Qn11 certainly turns off under the potential relation that {(word line potential level)+(threshold of Qn10/Qn11)}<{Vg+(threshold of Qp11/QP10)}. In this instance, the word line WL1/WLm is changed to the ground level, and it is necessary for the positive low power voltage level Vg to be higher than (threshold of QP10/Qp11 - threshold of Qn11/Qn10) with respect to the ground level.

The positive low power voltage level Vg is further expected to allow the latch circuit 11a to behave as a bi-stable data storage. If the positive low power voltage level Vg is greater than (gate potential level of Qn10/Qn11-threshold of Qn10/Qn11), both n-channel enhancement type switching transistors Qn10/Qn11 are turned off, and the latch circuit 11a can not serve as the bi-stable data storage. For this reason, the upper limit of the positive low power voltage Vg is equal to or less than the difference between the positive high power voltage Vdd and the threshold of the n-channel enhancement type switching transistors Qn10/Qn1.

Thus, the positive low power voltage Vg appropriately adjusted allows the flip-flop type latch circuit 11a to certainly change the logic level of the stored data bit.

The load elements R11/R12 are implemented by highly-resistive polysilicon strips or thin-film load transistors, and the gate electrodes of the n-channel enhancement type switching transistors Qn10/Qn11 are respectively connected to the drain nodes DN10/QN11 of the n-channel enhancement type switching transistors Qn11/Qn10. The p-channel enhancement type access transistors QP10/Qp11 are connected between the drain nodes DN11/DN10 and the bit lines BLa/BLb, and are formed in the semiconductor substrate 10. For this reason, the channel resistance of the p-channel enhancement type access transistor Qp10/Qp11 is much smaller than the load element R11/R12.

Turning back to FIG. 4, the addressing system 12 includes a row address decoder 12a for producing row address decoded signals RAD, a word line driver 12b responsive to the row address decoded signals RAD for selectively driving the word lines WL1 to WLm, a column address decoder 12c for producing column address decoded signals CAD and a column selector 12d responsive to the column address decoded signals CAD for selectively connecting the bit line pairs BLP1 to BLPn to a data bus DS. The word lines WL1 to WLm are respectively assigned row addresses, and one of the word lines WL1 to WLm is specified by a row address signal supplied from the outside of the static type random access memory device. When the row address signal reaches the row address decoder 12a, the row address decoder 12a changes one of the row address decoded signals RAD to the active low level, and causes the word line driver 12b to change the word line assigned the row address specified by the row address signal to the active low level or the ground level. The other word lines are maintained at the inactive high level.

The word line driver 12b has a plurality of word line driving circuits 12e, and the word line driving circuits 12e are respectively coupled to the word lines WL1 to WLm so as to selectively drive the word lines WL1 to WLm in response to the row address decoded signals RAD.

Figure 1:
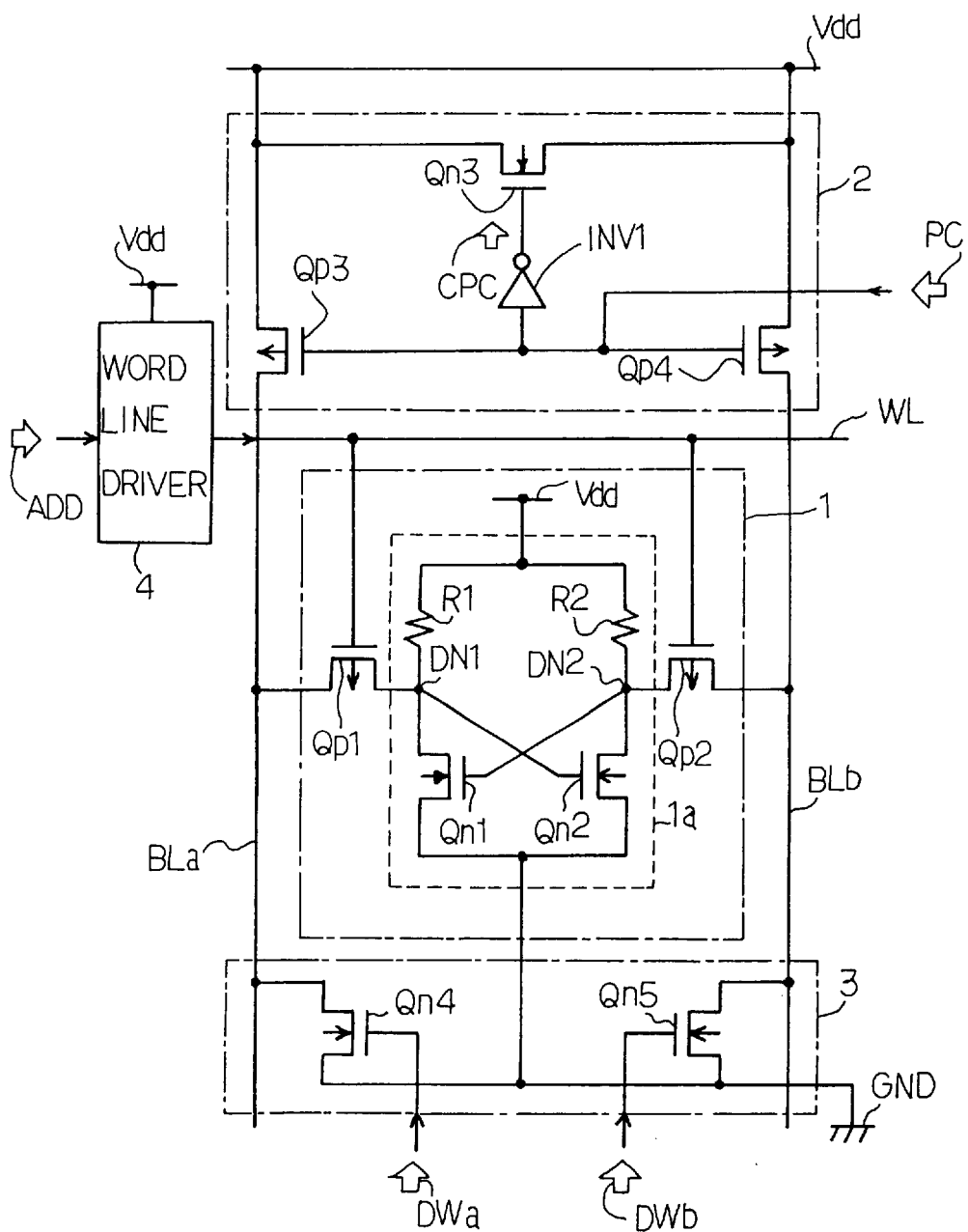
FIG. 1 is a circuit diagram showing the circuit arrangement of the prior art static type random access memory device.
Figure 2A:
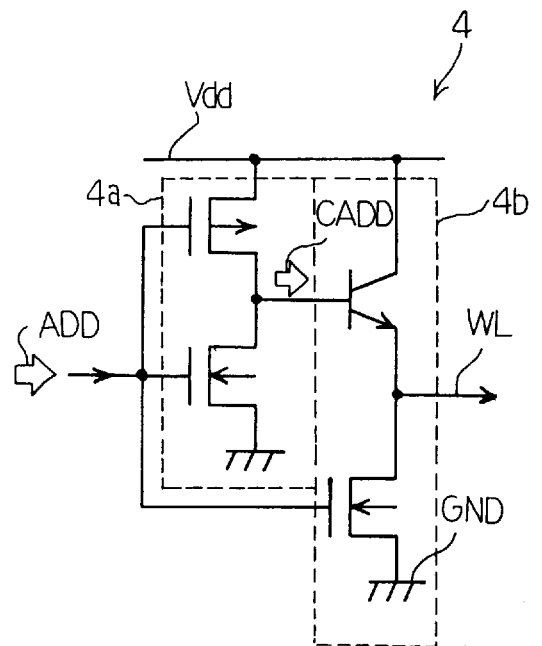
FIGS. 2A and 2B are circuit diagrams showing the circuit configurations of the word line driver incorporated in the prior art static random access memory device.
Figure 2B:
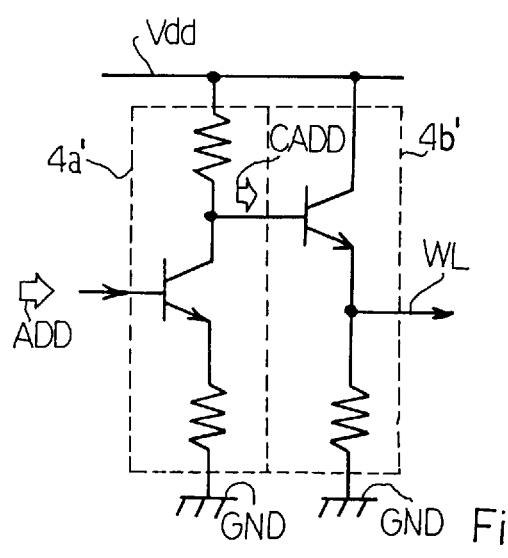
Figure 3:
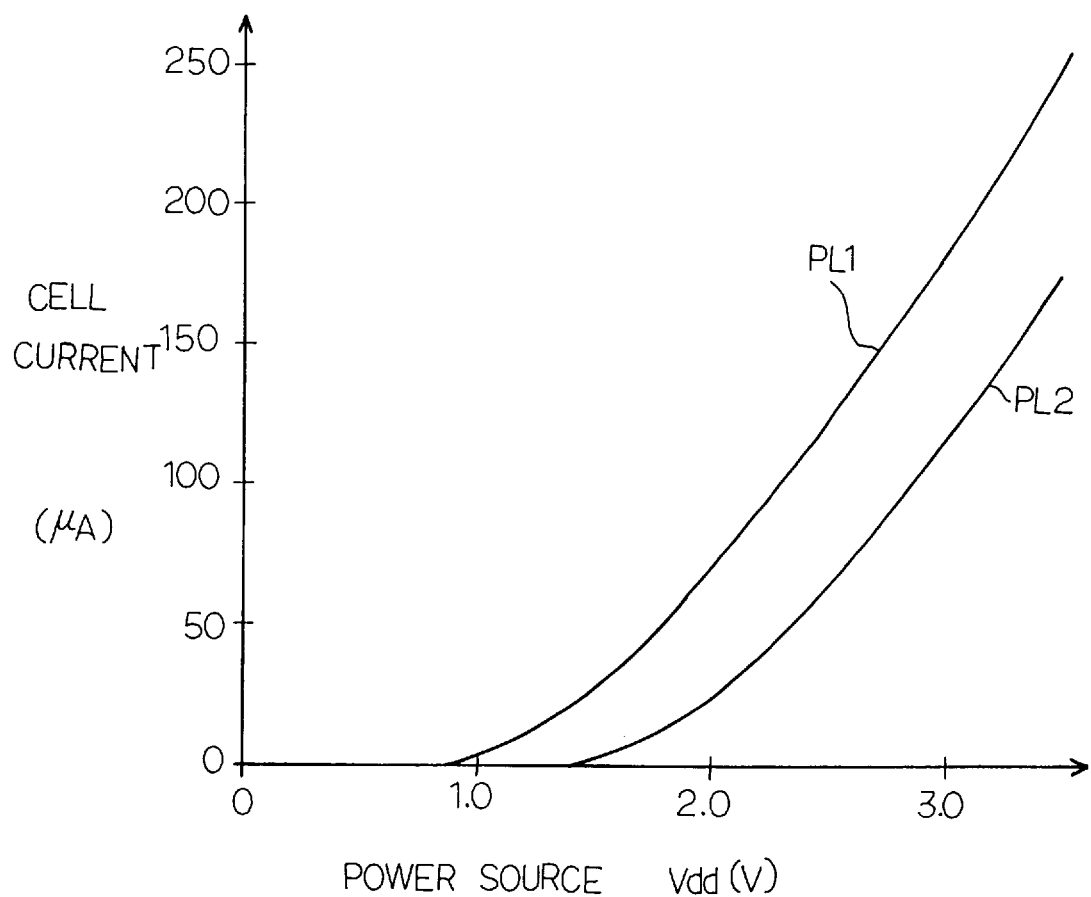
FIG. 3 is a graph showing the current driving capability of p-channel/n-channel field effect transistors in terms of the power voltage level.

The word line driving circuit 12e is similar in circuit configuration to the word line driver 4 shown in FIG. 2A or 2B, and is connected between the positive high voltage line Vdd and a ground line GND. For this reason, the word lines WL1 to WLm are changed between an inactive high level (Vdd - Vbe) and the ground level. Vbe represents the emitter-base forward bias voltage. The word line driving circuits 12e may be implemented by complementary inverters.

The bit line pairs BLP1 to BLPn are respectively assigned column addresses, and a column address signal representative of one of the column addresses is supplied from the outside. When the column address signal reaches the column address decoder 12c, the column address decoder 12c changes one of the column address decoded signals CAD to an active level, and the column selector 12d is responsive to the column address decoded signals CAD so as to connect the bit line pair specified by the column address signal to the data bus DS.

The read-write system 13 includes a precharge/balance circuit 13a connected between the positive high power voltage line Vdd and the bit line pairs BLP1-BLPn, a sense amplifier 13b connected to the data bus DS, a write-in circuit 13c also connected to the data bus DS and an input/output data buffer 13d connected between the sense amplifier/write-in circuit 13b/13c and an input/output data port 13e.

The precharge/balance circuit 13a includes a plurality of precharge/balance units 13f respectively associated with the bit line pairs BLP1 to BLPn, and the precharge/balance units 13f are similar in circuit configuration to one another. The precharge/balance unit 13f for the bit line pair BLP1 is detailed in FIG. 5. The precharge/balance unit 13f has p-channel enhancement type switching transistors Qp12/Qp13 connected between the positive high power voltage line Vdd and the bit lines BLa/BLb of the pair BLP1, an n-channel enhancement type switching transistor Qn12 connected between the bit lines BLa and BLb and an inverter INV10. A precharge control signal PC is supplied to the gate electrodes of the p-channel enhancement type switching transistors Qp12/Qp13 and the input node of the inverter INV10, and the inverter INV10 supplies a complementary precharge control signal CPC to the gate electrode of the n-channel enhancement type switching transistor Qn12. When the precharge control signal PC is changed to the ground level, the precharge control signal PC and the complementary precharge control signal CPC cause the p-channel enhancement type switching transistors Qp12/Qp13 and the n-channel enhancement type switching transistor Qn12 of all the precharge/balance units 13f to concurrently turn on, and the bit lines BLa/BLb of all the pairs BLP1 to BLPn are charged to and balanced at the positive high power voltage level Vdd.

The sense amplifier 13b is enabled with a sense enable signal SE, and amplifies a potential difference transferred from a selected bit line pair to the data bus DS.

A pair of n-channel enhancement type switching transistors Qn13/Qn14 form in combination the write-in circuit 13c, and a write-in data signal DWa and a complementary write-in data signal DWb are supplied to the gate electrodes of the n-channel enhancement type switching transistors Qn13/Qn14 for selectively discharging the bit lines BLa/BLb to the ground voltage line GND.

The input/output data buffer 13d produces the write-in data signal DWa and the complementary write-in data signal DWb from an input data signal Din and an output data signal Dout from the potential difference developed by the sense amplifier 13b. The input/output data buffer 13d selectively enables an input section and an output section depending upon the logic level of an output enable signal OE.

The power supply unit 14 generates the positive high power voltage Vdd and the positive low power voltage Vg from an external power voltage, and selectively distributes the positive power voltage Vdd, the positive low power voltage Vg and the ground level to the components of the static type random access memory device. A step-down circuit incorporated in the power supply unit 14 may generate the positive low power voltage Vg from the external power voltage.

Various external control signals such as an output enable signal representative of the read-out mode are supplied to the timing generator 15, and the timing generator 15 sequentially generates internal control signals such as the precharge control signal PC, the sense enable signal SE and the output enable signal OE. The internal control signals are sequentially supplied to the destinations at appropriate timings, and cause the memory cell array 11, the addressing system 12 and the read-write system 13 to cooperate with one another for a data write-in and a data read-out.

Subsequently, description is made on the data writein and the data read-out. The memory cell M11 is selected from the memory cell array 11, and a write-in data bit is opposite in logic level to the data bit already stored in the memory cell M11. The stored data bit is assumed to set the positive high power voltage level Vdd and a positive low potential level approximately equal to the positive low power voltage level Vg on the drain nodes DN11 and Dn10, respectively.

The precharge/balance circuit 13a changes and balances all of the bit line pairs BLP1 to BLPn at the positive high power voltage level Vdd in response to the precharge control signal PC. The row address decoder decodes the row address signal representative of the row address assigned to the word line WL1, and causes the word line driver 12b to change the word line WL1 to the ground level. On the other hand, the column address decoder 12c decodes the column address signal representative of the column address assigned to the bit line pair BLP1, and causes the column selector 12d to connect the data bus DS to the bit line pair BLP1.

The input data signal representative of the write-in data bit is supplied through the input/output data port 13e to the input/output data buffer 13d, and the input/output data buffer 13d generates the write-in data signals DWa and DWb to the active high level and the inactive low level, respectively. The write-in data signals DWa and DWb are supplied to the write-in circuit 13c, and the write-in data signal DWa causes the n-channel enhancement type switching transistor Qn13 to turn on. The other n-channel enhancement type switching transistor Qn14 is maintained in the off-state. The n-channel enhancement type switching transistor Qn13 connects the bit line BLa to the ground line GND, and the other n-channel enhancement type switching transistor Qn14 isolates the bit line BLb from the ground line GND.

Then, the bit line BLa is discharged to the ground line GND, and the potential level on the bit line BLa is gradually decayed from the positive high power voltage level Vdd toward the ground level GND. However, the bit line BLb is maintained at the positive high power voltage level Vdd.

When the bit line BLa reaches a certain potential level higher than the potential level on the word line WL1 or the ground level GND by the threshold of the p-channel enhancement type access transistor QP10, the p-channel enhancement type access transistor QP10 turns off, and isolates the drain node DN11 from the bit line BLa. However, the n-channel enhancement type switching transistor Qn11 has already turned off, because the potential level at the drain node DN11 became lower than the positive low power voltage level Vg by more than the threshold of the n-channel enhancement type switching transistor Qn11. On the other hand, the other drain node is as high as the positive high power voltage level Vdd, and causes the n-channel enhancement type switching transistor Qn10 to turn on. As a result, the drain node attains a potential level approximately equal to the positive low power voltage level Vg, and the other drain node becomes the positive high power voltage level Vdd. Thus, the write-in data bit is certainly stored in the memory cell M11.

In this instance, the active level of the word lines WL1 to WLm is the ground level, and the threshold of the p-channel enhancement type access transistors QP10/Qp11 is 0.6 volt. Even if the flip-flop type latch circuit 11a has an inversive threshold of the order of 0.1 volt, the positive low power voltage Vg allows the certain potential level at the drain node DN11/DN10 to certainly change the status of the latch circuit 11a.

The positive low power voltage Vg does not affect the charge supply from the other bit line BLb to the drain node DN10, because the positive high power voltage Vdd is fully applied between the gate electrode and the source node of the p-channel enhancement type access transistor Qp11.

On the other hand, when an external device tries to access the data bit stored in the memory cell Ms, the precharge-balance circuit 13a charges and balances the bit line pairs BLP1 to BLPn, and the word line driver 12b and the column selector 12d select the word line WL1 and the bit line pair BLP1, respectively.

The memory cell M11 is assumed to store a data bit represented by the positive high power voltage level Vdd at the drain node DN10 and the certain positive low potential level at the other drain node DN11. Although no cell current flows through the p-channel enhancement type access transistor Qp11, bit line BLa is decayed toward the certain positive low potential level, and cell current flows from the bit line BLa through the p-channel enhancement type access transistor Qp10 and the n-channel enhancement type switching transistor QnO to the positive low power voltage line Vg. Even though the positive low power voltage Vg is applied to the source node of the n-channel enhancement type switching transistor Qn10, the decrement of cell current is negligible.

Figure 6:
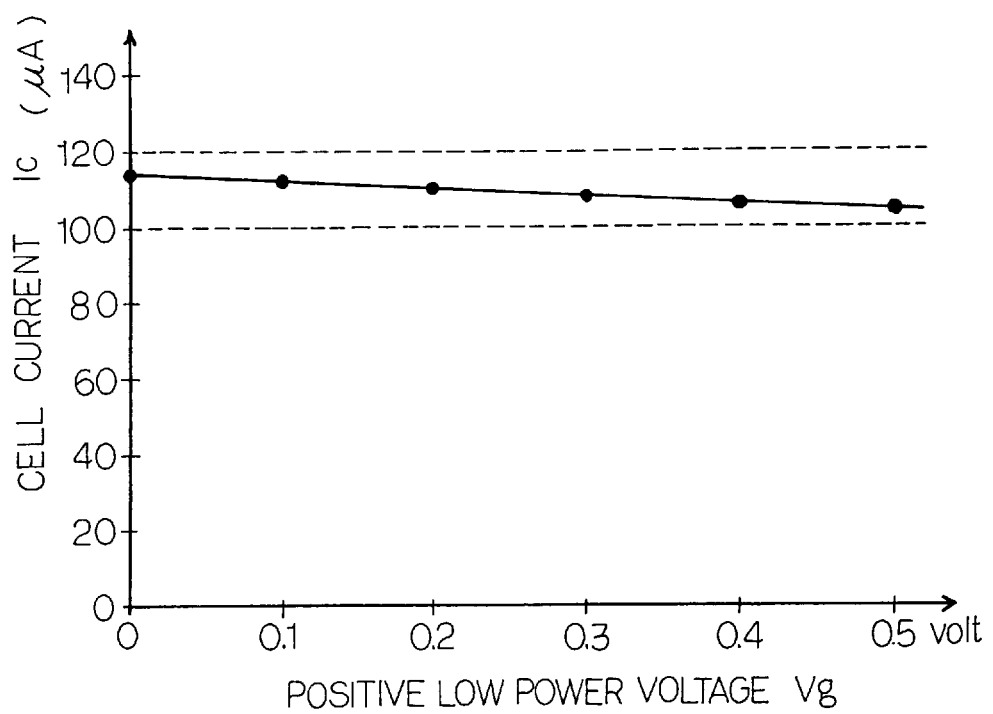
FIG. 6 is a graph showing cell current in terms of a low power voltage level applied to the memory cell.

The present inventor measured the cell current Ic in terms of the positive low power voltage level Vg, and the cell current Ic was plotted in FIG. 6. Even through the source node of the n-channel enhancement type switching transistor Qn10 was increased from the ground level to 0.5 volt, the reduction of cell current was less than 10 percent. Thus, the static type random access memory device according to the present invention enhances the reliability of stored data bits without sacrifice of the data access speed.

Second Embodiment

Figure 7:
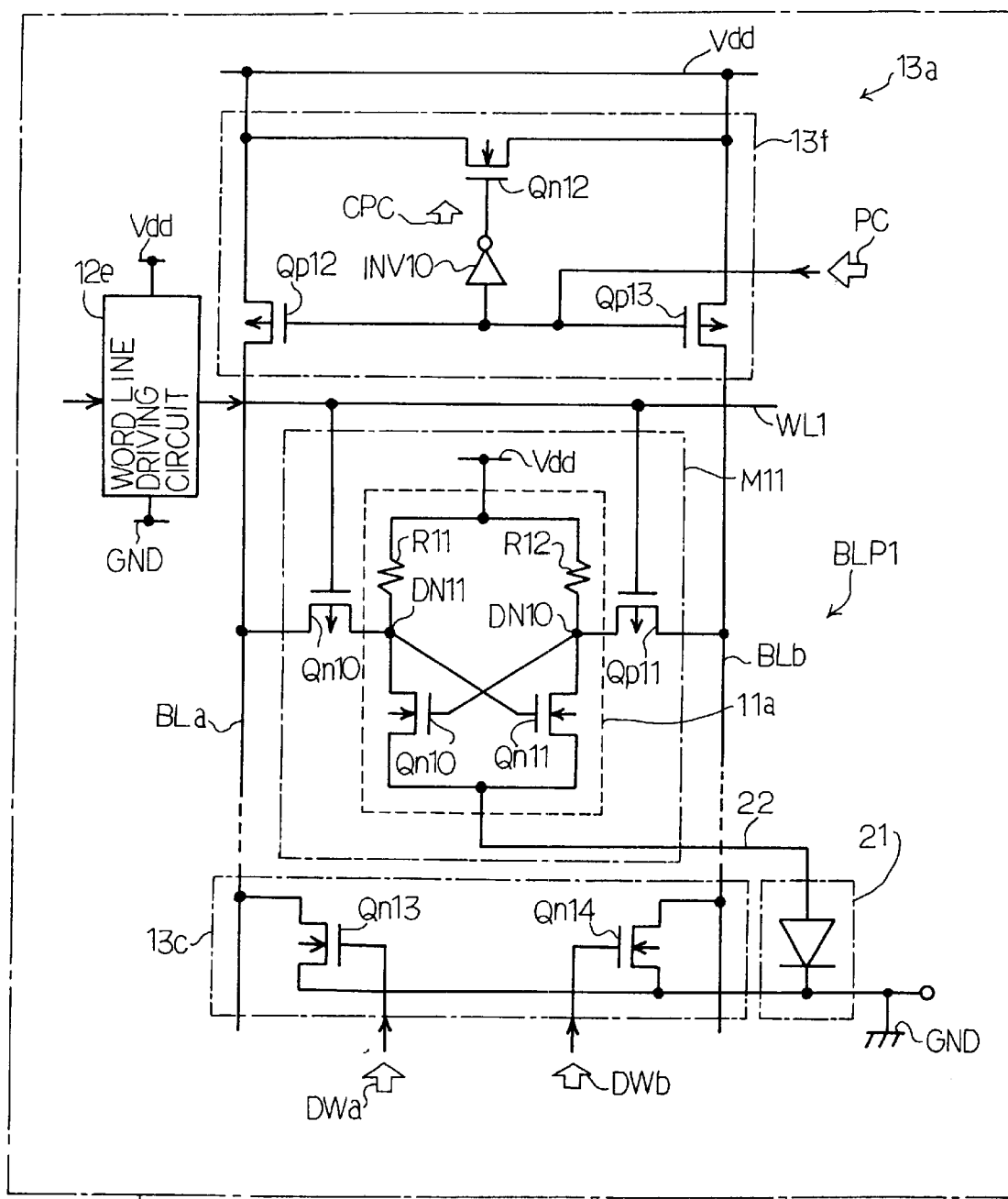
FIG. 7 is a circuit diagram showing the circuit arrangement of another static type random access memory device according to the present invention.

Turning to FIG. 7 of the drawings, another static type random access memory device embodying the present invention is fabricated on a semiconductor substrate 20. The static type random access memory device implementing the second embodiment is similar to that of the first embodiment except for a diode 21 connected between the latch circuits of memory cells and a ground line GND, and, for this reason, the other circuit components are labeled with the same references designating corresponding circuit components of the first embodiment without detailed description.

The diode 21 increases the potential level on the source line 22, and the forward bias voltage of the diode 21 is regulated to a certain value equal to the difference between the positive low power level Vg and the ground level GND.

Thus, the diode 21 generates the positive low power voltage level Vg on the source line 22, and makes the power supply unit 14 simple.

The static type random access memory device implementing the second embodiment behaves in the data write-in and the data read-out as similar to the first embodiment, and enhances the reliability of stored data bits without sacrifice of the data access speed.

Third Embodiment

Figure 8:
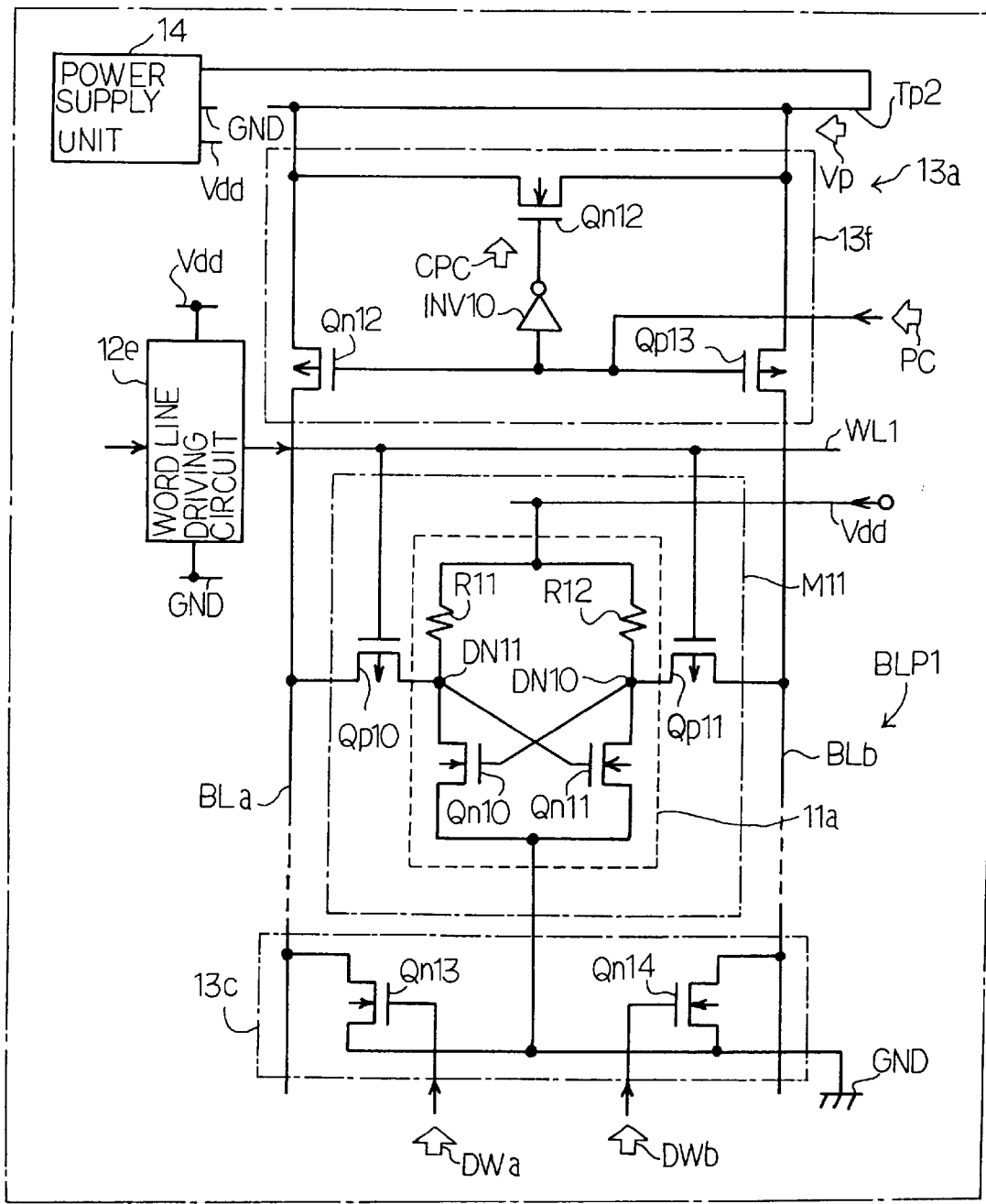
FIG. 8 is a circuit diagram showing the circuit arrangement of yet another static type random access memory device according to the present invention.

Turning to FIG. 8 of the drawings, yet another static type random access memory device embodying the present invention is fabricated on a semiconductor substrate 30. The static type random access memory device implementing the third embodiment is similar to the first embodiment except for a precharge level Vp on a precharge line Tp2 and a low potential level supplied to the latch circuit 11a. For this reason, the other components of the static type random access memory device are labeled with the same references as those of the corresponding components incorporated in the first embodiment without detailed description.

The source nodes of the n-channel enhancement type switching transistors Qn10/Qn11 are connected to the ground line GND, and the latch circuit 11a is powered with the positive high power voltage level Vdd and the ground level GND.

The power supply unit 14 may generate the precharge level Vp lower than the positive high power level Vdd so as to supply the precharge level Vp to the precharge line Tp2. When the precharge control signal PC is changed to the active low level, the precharge/balances circuit 13a balance the bit lines BLa/BLb of each bit line pair at the precharge level Vp.

As described hereinbefore, the word line driving circuit 12e has an output driver implemented by an emitter-follower, and a selected word line is changed between the ground level and the positive potential level lower than the positive high power voltage Vdd by the emitter-base forward bias of the bipolar transistor, i.e., (Vdd - Vbe). The precharge level Vp is adjusted in such a manner that the difference between the precharge level Vp and the positive potential level (Vdd - Vbe) is less than the threshold of the p-channel enhancement type access transistors QP10/Qp11. For this reason, while the word line WL1 is maintained at the inactive potential level (Vdd - Vbe), the p-channel enhancement type access transistors QP10/Qp11 are surely turned off, and no leakage current flows from the bit line BLa/BLb through the p-channel enhancement type access transistors QP10/Qp11.

In this instance, the threshold of the p-channel enhancement type access transistors Qp10/Qp11 is 0.6 volt, and the emitter-base forward bias Vbe is 0.7 volt. The precharge level Vp is less than (Vdd−0.7+0.6)=Vdd−0.1 volt. If the precharge level Vp is 0.3 volt lower than the positive high power voltage Vdd, the p-channel enhancement type access transistors QP10/Qp11 are perfectly turned off in the presence of the inactive potential level (Vdd - Vbe) on the word line WL1.

Although the amount of cell current is slightly decreased due to the low precharge level Vp, the decrement is quite small, and the precharge level Vp does not lower the data write-in speed.

Thus, the p-channel enhancement type access transistors Qp10/Qp11 perfectly isolate the latch circuit 11a from the bit lines BLa/BLb, and allow a manufacturer to increase the memory cells coupled to each bit line pair without a malfunction. Even though the threshold of the p-channel enhancement type access transistors QP10/Qp11 is not enlarged, the memory cells are perfectly blocked from the bit lines BLa/BLb, and the data write-in characteristics are never deteriorated.

Fourth Embodiment

Figure 9:
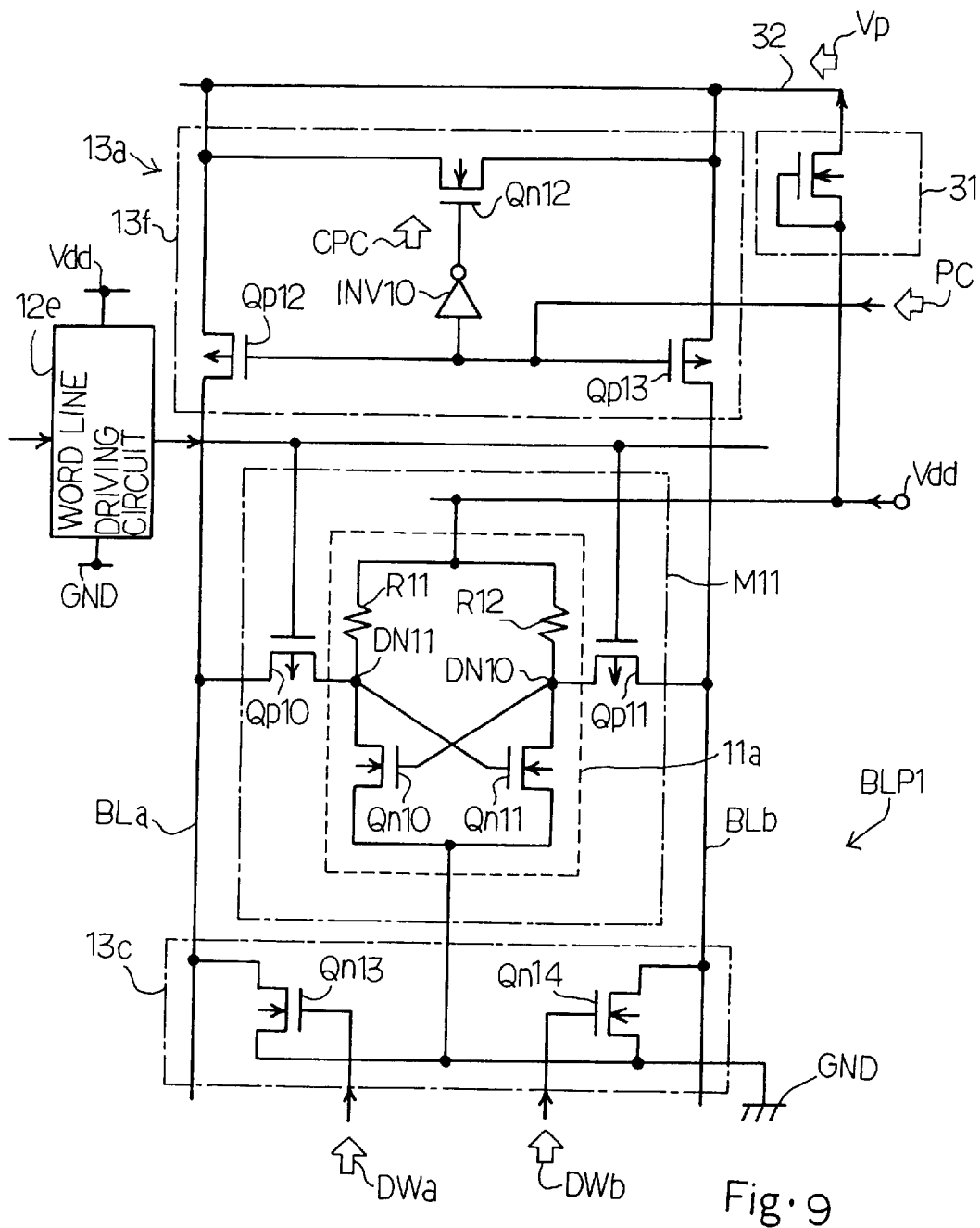
FIG. 9 is a circuit diagram showing the circuit arrangement of still another static type random access memory device according to the present invention.

FIG. 9 of the drawings illustrates still another semiconductor static type random access memory device embodying the present invention. The semiconductor static type random access memory device is similar in circuit arrangement to the third embodiment except for a diode-connected n-channel enhancement type field effect transistor 31. For this reason, the other components are labeled with the same references designating corresponding components of the first embodiment without detailed description.

The diode-connected n-channel enhancement type field effect transistor 31 is connected between the positive high power voltage line Vdd and a precharge line 32 and the positive high power voltage line Vdd, and steps down the positive high power voltage Vdd to the precharge level Vp.

The semiconductor static type random access memory device achieves all the advantages of the third embodiment, and makes the power supply unit 14 simple.

Although particular embodiments of the present invention have been shown and described, it will be obvious to those skilled in the art that various changes and modifications may be made without departing from the spirit and scope of the present invention.

For example, the latch circuit may be implemented by two complementary inverters. P-channel enhancement type access transistors are connected between bit lines and common drain nodes of the complementary inverters. In this instance, the positive low power voltage Vg allows the inversive threshold of the latch circuit to be sufficiently higher than the minimum low potential level at one of the common drain nodes, and increases the noise margin of the latch circuit.

A semiconductor static type random access memory device according to the present invention may form a part of a large scale integration or be separately fabricated on more than one semiconductor chip.

What is claimed is:

1. A semiconductor static type random access memory device comprising:
   a plurality of addressable memory cells, each including a bi-stable latch circuit connected between a high power voltage line and a low power voltage line, and first and second p-channel type access transistors having conductive channels connected to first and second memory nodes of said bi-stable latch circuit for storing a data bit in the form of potential difference between said first and second memory nodes;
   a plurality of bit line pairs selectively connected to the conductive channels of the first and second p-channel type access transistors of said plurality of addressable memory cells for propagating data bits thereto and therefrom;
   means for supplying a low power voltage to said low power voltage line;
   a plurality of word lines selectively connected to gate electrodes of said first and second p-channel type access transistors of said plurality of addressable memory cells, and selectively driven to an active low level below said low power voltage for selectively connecting the first and second memory nodes of said plurality of addressable memory cells to said plurality of bit line pairs; and
   a write-in circuit connectable through one of said plurality of bit line pairs to each of said plurality of addressable memory cells, and responsive to a write-in data bit for selectively connecting bit lines of said one of said plurality of bit line pairs to a discharging line, a potential level on said discharging line being lower than said low power voltage.

2. The semiconductor static type random access memory device as set forth in claim 1, in which said low power voltage line is independent from said discharging line and a source of said active low level.

3. The semiconductor static type random access memory device as set forth in claim 1, further comprising a power supply unit having a power supply circuit serving as said means.

4. The semiconductor static type random access memory device as set forth in claim 1, in which said means is implemented by a diode having a cathode connected to said low power voltage line and an anode connected to said discharging line.

5. The semiconductor static type random access memory device as set forth in claim 1, further comprising a precharging circuit connected between said high power voltage line and said plurality of bit line pairs and responsive to a precharge control signal for charging said plurality of bit line pairs at a high power voltage level equal to the potential level on said high power voltage line before a data write-in.

6. The semiconductor static type random access memory device as set forth in claim 5, further comprising
   an addressing system for selecting one of said plurality of word lines to be driven to said active low level and said one of said plurality of bit line pairs to be connected to said write-in circuit.

7. A semiconductor static type random access memory device comprising:
   a plurality of addressable memory cells each including a bi-stable latch circuit connected between a high power voltage line and a low power voltage line and first and second p-channel type access transistors having conductive channels connected to first and second memory nodes of said bi-stable latch circuit for storing a data bit in the form of potential difference between said first and second memory nodes;
   a plurality of bit line pairs selectively connected to the conductive channels of the first and second p-channel type access transistors of said plurality of addressable memory cells for propagating data bits thereto and therefrom;

a plurality of word lines selectively connected to gate electrodes of said first and second p-channel type access transistors of said plurality of addressable memory cells, and selectively driven from an inactive high level lower than a high power voltage level on said high power voltage line to an active low level for selectively connecting the first and second memory nodes of said plurality of addressable memory cells to said plurality of bit line pairs;

a precharging line independent from said high power voltage line and said low power voltage line;

a precharging circuit connected between said precharging line and said plurality of bit line pairs for charging said plurality of bit line pairs at a precharge level lower than said high power voltage level before a data read-out from memory cells selected from said plurality of memory cells to said plurality of bit line pairs; and means for generating said precharge level on said precharging line.

8. The semiconductor static type random access memory device as set forth in claim 7, further comprising a power supply unit having a power supply circuit serving as said means.

9. The semiconductor static type random access memory device as set forth in claim 7, wherein said means is implemented by a diode connected between said high power voltage line and said precharging line.

10. The semiconductor static type random access memory device as set forth in claim 7, further comprising a write-in circuit connectable through one of said plurality of bit line pairs to each of said plurality of addressable memory cells, and responsive to a write-in data bit, for selectively connecting bit lines of said one of said plurality of bit line pairs to a discharging line.

11. The semiconductor static type random access memory device as set forth in claim 10, further comprising an addressing system for selecting one of said plurality of word lines to be driven to said active low level and said one of said plurality of bit line pairs to be connected to said write-in circuit.

12. The semiconductor static type random access memory device as set forth in claim 11, wherein said addressing system includes a word line driver having a plurality of word line driving circuits respectively connected to said plurality of word lines, wherein each of said plurality of word line driving circuits has an output driver implemented by an emitter follower connected between said high power voltage line and said low power voltage line, and wherein said inactive high level is lower than said high power voltage level by an emitter-base forward voltage of a bipolar transistor forming a part of said emitter follower.

13. The semiconductor static type random access memory device as set forth in claim 7, in which a difference between said precharging level and said inactive high level is less than a threshold of said first and second p-channel type field effect transistors.

\* \* \* \* \*